United States Patent
Tanaka

(10) Patent No.: US 10,483,388 B2
(45) Date of Patent: Nov. 19, 2019

(54) NITRIDE SEMICONDUCTOR EPITAXIAL SUBSTRATE AND SEMICONDUCTOR DEVICE

(71) Applicants: SCIOCS COMPANY LIMITED, Ibaraki (JP); SUMITOMO CHEMICAL COMPANY, LIMITED, Tokyo (JP)

(72) Inventor: Takeshi Tanaka, Ibaraki (JP)

(73) Assignees: SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/010,812

(22) Filed: Jun. 18, 2018

(65) Prior Publication Data

US 2018/0366572 A1  Dec. 20, 2018

(30) Foreign Application Priority Data

Jun. 20, 2017 (JP) ................. 2017-120078

(51) Int. Cl.
*H01L 29/778* (2006.01)
*H01L 29/10* (2006.01)
*H01L 29/205* (2006.01)
*H01L 29/20* (2006.01)

(52) U.S. Cl.
CPC ...... *H01L 29/7787* (2013.01); *H01L 29/1029* (2013.01); *H01L 29/7786* (2013.01); *H01L 29/2003* (2013.01); *H01L 29/205* (2013.01)

(58) Field of Classification Search
None
See application file for complete search history.

(56) References Cited

U.S. PATENT DOCUMENTS

| 2010/0289029 A1 | 11/2010 | Ichimura et al. |
| 2013/0187172 A1 | 7/2013 | Tanaka et al. |

FOREIGN PATENT DOCUMENTS

| EP | 2251464 A2 | 11/2010 |
| JP | 2013-175696 A | 9/2013 |
| JP | 2014-183124 A | 9/2014 |

(Continued)

OTHER PUBLICATIONS

Cheney, David, et al. "Degradation Mechanisms for GaN and GaAs High Speed Transistors." Materials, vol. 5, No. 12, 2012, pp. 2498-2520., doi:10.3390/ma5122498. (Year: 2012).*

(Continued)

*Primary Examiner* — J. E. Schoenholtz
(74) *Attorney, Agent, or Firm* — Pearne & Gordon LLP

(57) ABSTRACT

There is provided a nitride semiconductor epitaxial substrate, including: a substrate; a first nitride semiconductor layer formed on the substrate, as an electron transit layer in which two-dimensional electron gas exists; and a second nitride semiconductor layer formed on the first nitride semiconductor layer, as an electron supply layer, wherein the second nitride semiconductor layer includes a portion in which a hydrogen concentration is higher than that of the first nitride semiconductor layer and a difference of the hydrogen concentration from that of the first nitride semiconductor layer is $2 \times 10^{18}$ cm$^{-3}$ or less.

6 Claims, 3 Drawing Sheets

(56) References Cited

FOREIGN PATENT DOCUMENTS

JP          2014183124 A   *   9/2014
JP          2015-177152 A       10/2015

OTHER PUBLICATIONS

Machine Translation of JP 2014-183124 (Year: 2014).*
Search Report issued in European Patent Application No. 18184547 dated Feb. 6, 2019.
Nguyen, C. et al., "High Performance Gan/Aigan Modfets Grown by RF-Assisted MBE", Electronics Letters, IEE Stevenage, GB, vol. 34, No. 3, Feb. 5, 1998.
Search Report issued in European Patent Application No. 18187707 dated Nov. 23, 2018.
Mimila-Arroyo, J. et al., "Improvement of AlGaN/GaN/Si high electron mobility heterostructure performance by hydrogenation", Applied Physics Letters, A I P Publishing LLC, US, vol. 102, No. 9, pp. 92104, Mar. 4, 2013.
Jean-Guy Tartarin, et al., "Generation-Recombination Defects in AlGaN/GaN HEMT on SiC Substrate, Evidenced by Low Frequency Noise Measurements and SIMS Characterization," AIP Conference Proccedings, vol. 922, pp. 163-166, Jan. 2007.

* cited by examiner

NITRIDE SEMICONDUCTOR EPITAXIAL SUBSTRATE AND SEMICONDUCTOR DEVICE

BACKGROUND

Technical Field

The present disclosure relates to a nitride semiconductor epitaxial substrate and a semiconductor device.

Description of the Related Art

For example, as a nitride semiconductor epitaxial substrate used for a high electron mobility transistor (HEMT), the following substrate is known such as a substrate including a gallium nitride (GaN) layer formed on a silicon carbide (SiC) substrate, functioning as an electron transit layer, and an aluminum gallium nitride (AlGaN) layer formed on the GaN layer, functioning as an electron supply layer, and constituted so that two-dimensional electron gas exists in the GaN layer on a side of the AlGaN layer (see patent document 1 for example).

Patent document 1: Japanese Patent Laid Open Publication No. 2013-175696

SUMMARY

In the nitride semiconductor epitaxial substrate, there is a probability of generating an aging variation such that a concentration of two-dimensional electron gas existing in the GaN layer is reduced. Since such an aging variation causes a fluctuation of a device property when HEMT is constituted, a generation of the aging variation should be suppressed.

An object of the present disclosure is to provide a nitride semiconductor epitaxial substrate and a semiconductor device capable of suppressing the aging variation of two-dimensional electron gas.

According to an aspect of the present disclosure, there is provided a nitride semiconductor epitaxial substrate, including:

a substrate;

a first nitride semiconductor layer formed on the substrate, as an electron transit layer in which two-dimensional electron gas exists; and a second nitride semiconductor layer formed on the first nitride semiconductor layer, as an electron supply layer, wherein the second nitride semiconductor layer has a portion in which a hydrogen concentration is higher than that of the first nitride semiconductor layer and a difference of the hydrogen concentration from that of the first nitride semiconductor layer is $2 \times 10^{18}$ cm$^{-3}$ or less.

According to the present disclosure, the aging variation of two-dimensional electron gas can be suppressed.

DETAILED DESCRIPTION OF THE PRESENT DISCLOSURE

An Embodiment of the Present Disclosure

An embodiment of the present disclosure will be described hereafter, with reference to the drawings.

(1) A Basic Constitution of a Nitride Semiconductor Epitaxial Substrate

First, an explanation will be given for a basic constitution example of a nitride semiconductor epitaxial substrate according to this embodiment.

The nitride semiconductor epitaxial substrate is a substrate-shaped structure used as a base body when manufacturing a semiconductor device such as HEMT described later. The nitride semiconductor epitaxial substrate is also referred to as "an intermediate body" or "an intermediate precursor" hereafter, because it is used as the base body of the semiconductor device.

Figure 1:
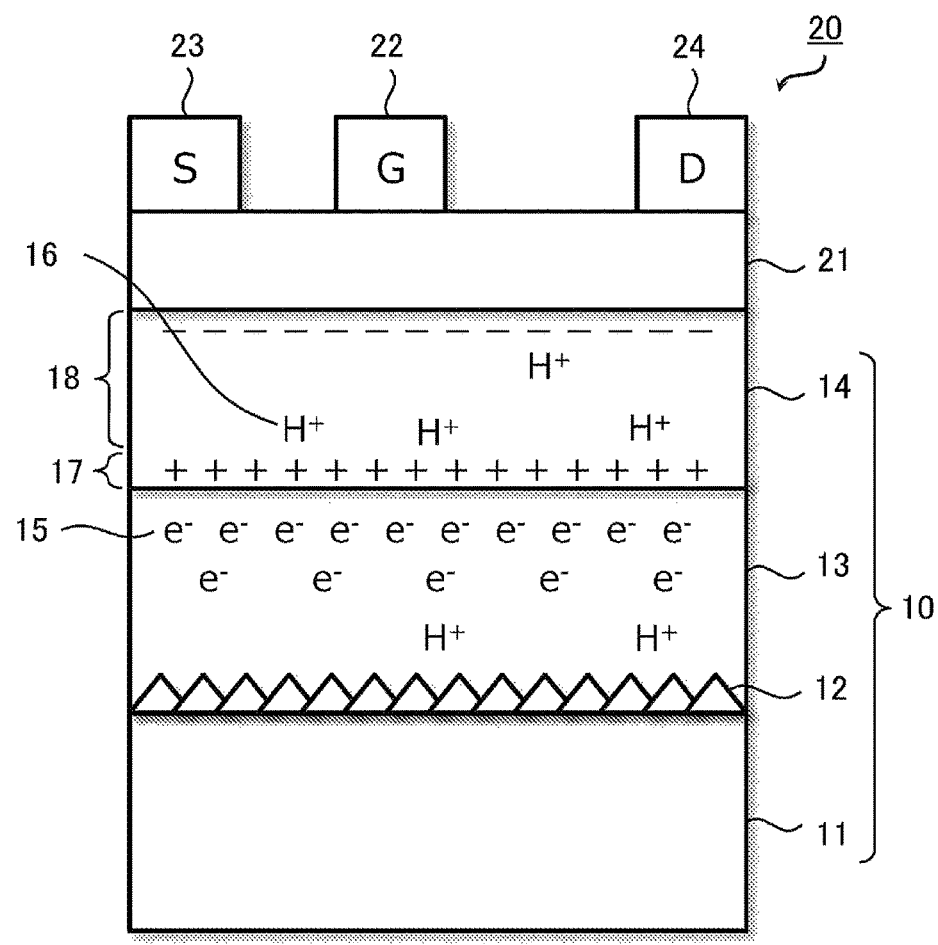
FIG. 1 is an explanation view showing a schematic constitution example of a nitride semiconductor template and a semiconductor device according to the present disclosure.

As shown in FIG. 1, an intermediate body 10 according to this embodiment is constituted including at least a substrate 11, a nucleation layer 12 formed on the substrate 11, a first nitride semiconductor layer 13 formed on the nucleation layer 12, and a second nitride semiconductor layer 14 formed on the first nitride semiconductor layer 13.

(Substrate)

The substrate 11 is constituted as a base substrate for growing the nucleation layer 12 and the first nitride semiconductor layer 13, etc., and is constituted using a SiC substrate for example. Specifically, a semi-insulating SiC substrate of a polytype-4H or a polytype-6H for example, is used as the substrate 11. Numerals of 4H and 6H show repeating cycles in a c-axis direction, and H of 4H and 6H shows a hexagonal crystal. Further, the term of "semi-insulating" used in this specification, means a state in which a specific resistance is $10^5$ Ω·cm or more for example. The substrate 11 has the semi-insulation, and thereby it is possible to prevent free electron from diffusing toward the substrate 11 from a side of the first nitride semiconductor layer 13, and reduce a leakage current, when a semiconductor device 20 described later is constituted. An semi-insulating SiC substrate is preferably used as the substrate 11. An electrically conductive SiC substrate, a sapphire substrate, a silicon substrate, and a GaN substrate, etc., may be used as the substrate 11.

(Nucleation Layer)

The nucleation layer 12 is mainly composed of AlN which is a group III nitride semiconductor for example. The nucleation layer 12 is constituted so that its one side (for example, the side of the substrate 11) mainly functions as a buffer layer for buffering a difference of a lattice constant between the substrate 11 and the first nitride semiconductor layer 13, and the other side (for example, the side of the first nitride semiconductor layer 13) mainly functions as a nucleation layer for generating nucleus for a crystal growth of the first nitride semiconductor layer 13. Hereafter, the nucleation layer 12 is also referred to as "an AlN layer" or "an AlN buffer layer".

(First Nitride Semiconductor Layer)

The first nitride semiconductor layer 13 is mainly composed of GaN which is the group III nitride semiconductor for example. The first nitride semiconductor layer 13 is constituted so that its one side (for example, the side of the AlN buffer layer 12) mainly functions as a buffer layer for buffering a difference of a lattice constant between the AlN buffer layer 12 and the first nitride semiconductor layer 13, and the other side (for example, the side of the second nitride semiconductor layer 14) mainly functions as an electron transit layer (a channel layer) for transiting electron. Two-dimensional electron gas (2DEG) 15 exists on the side functioning as the electron transit layer. 2DEG 15 is induced by piezo electric effect which is an effect of generating an electric field due to strain of crystals in the second nitride semiconductor layer 14, and which is caused by the difference of the lattice constant between the first nitride semiconductor layer 13 and the second nitride semiconductor layer 14. Further, a surface on the side functioning as the electron transit layer (an upper surface of the first nitride semiconductor layer 13) is a group III atom-polarity plane (+c plane). Hereafter, the first nitride semiconductor layer 13 is also referred to as "a GaN layer" or "a GaN-channel/buffer layer".

(Second Nitride Semiconductor Layer)

The second nitride semiconductor layer 14 is made of a group III nitride semiconductor having a wider bandgap than that of the group III nitride semiconductor constituting the GaN-channel/buffer layer 13 and a smaller lattice constant than that of the group III nitride semiconductor constituting the GaN-channel/buffer layer 13, and is mainly composed of $Al_xGa_{1-x}N$ (0<x<1) for example. The second nitride semiconductor layer 14 is constituted so as to function as an electron supply layer for supplying electron to the electron transit layer of the GaN-channel/buffer layer 13, and so as to function as a barrier layer for spatially confining 2DEG 15. A surface (an upper surface) of the second nitride semiconductor layer 14 is the group III atom-polarity plane (+c plane). By such a constitution, a spontaneous polarization and a piezoelectric polarization occur in the second nitride semiconductor layer 14. By its polarization action, 2DEG 15 is induced at a high concentration near a hetero-junction interface in the GaN-channel/buffer layer 13. Hereafter, the second nitride semiconductor layer 14 is also referred to as "an AlGaN layer" or "an AlGaN barrier layer".

(2) A Basic Constitution of a Semiconductor Device

Next, an explanation will be given for a basic constitution example of a semiconductor device 20 constituted using the intermediate body 10 having the abovementioned constitution, namely, the semiconductor device 20 according to this embodiment. Here, an explanation will be given for an example of HEMT which is one of field effect transistors (FET), as the semiconductor device 20.

As shown in FIG. 1, HEMT 20 according to this embodiment is constituted including the intermediate body 10 having the abovementioned constitution, a third nitride semiconductor layer 21 formed on the AlGaN barrier layer 14 in the intermediate body 10, and a gate electrode 22, a source electrode 23, a drain electrode 24 which are formed on the third nitride semiconductor layer 21.

(Third Nitride Semiconductor Layer)

The third nitride semiconductor layer 21 is mainly composed of GaN which is the group III nitride semiconductor for example. The third nitride semiconductor layer 21 is interposed between the AlGaN barrier layer 14 and the gate electrode 22 in order to improve a device property (a controllability of a threshold voltage, etc.) when for example HEMT 20 is constituted. However, the layer 21 is not necessarily an essential constituent component, HEMT 20 may be constituted by omitting the layer 21. Hereafter, the third nitride semiconductor layer 21 is also referred to as "a GaN cap layer".

(Electrode)

The gate electrode 22 is constituted of a multilayer structure (Ni/Au) of nickel (Ni) and gold (Au) for example. Here, when referring to a multilayer structure of X/Y in this specification, it means that X and Y are laminated in this order.

The source electrode 23 is placed at a position apart from the gate electrode 22 by a predetermined distance, and is constituted of a multilayer structure (Ti/Al) of titanium (Ti) and aluminum (Al) for example.

The drain electrode 24 is placed at a position apart from the gate electrode 22 by a predetermined distance, on an opposite side to the source electrode 23 interposing the gate electrode 22, and is constituted of the multilayer structure (Ti/Al) of Ti and Al similarly to the source electrode 23.

The source electrode 23 and the drain electrode 24 may be constituted by laminating the multilayer structure of Ni/Au on the multilayer structure of Ti/Al.

(3) Knowledge Obtained by Inventors

In HEMT 20 having the abovementioned constitution, a polarization occurs in the AlGaN layer 14 which is the second nitride semiconductor layer, so that a side of the GaN layer 13 which is the first nitride semiconductor layer is + polarity and a side of the GaN cap layer 21 which is the third nitride semiconductor layer is − polarity. By its polarization action, 2DEG 15 is induced at a high concentration near the hetero-junction interface in the GaN layer 13.

Further, in the AlGaN layer 14 having a strong bonding force with an impurity, proton (cation) 16 of hydrogen (H) which is an example of the impurities, exists at a higher concentration than that of the GaN layer 13. In such a case, electron in the GaN layer 13 attracted on the side of the AlGaN layer 14 by excessive H-proton 16 also constitutes 2DEG 15 in the GaN layer 13.

Incidentally, H-proton 16 existing in the AlGaN layer 14 is very small and easy to move. Therefore, in a use mode such that HEMT 20 is operated in a heated state for example, it is conceivable that H-proton 16 escapes from the AlGaN layer 14. When the escape of H-proton 16 occurs, there is a possibility that electron in the GaN layer 13 attracted to H-proton 16 also escapes from the GaN layer 13 together with H-proton 16. As a result thereof, an aging variation occurs such that 2DEG 15 in the GaN layer 13 escapes from the GaN layer 13 for example. Such an aging variation of 2DEG 15 causes a fluctuation of the device property to occur when HEMT 20 is constituted, and therefore the occurrence of the aging variation should be suppressed.

The inventors of the present application pay attention to the fact that one of factors of generating the aging variation of 2DEG 15 is that more H-proton 16 escapes from the AlGaN layer 14 compared to escape from the GaN layer 13. Then, it is also found by the inventors that when a difference of concentration is suppressed to be small, between a H-concentration in the AlGaN layer 14 and a H-concentration in the GaN layer 13 in which 2DEG 15 is formed, even in a case that H-proton 16 escapes from the AlGaN layer 14, escape of the electron constituting 2DEG 15 from an inside of the GaN layer 13 can be suppressed, because the same amount of H-proton 16 also escapes from the GaN layer 13 together with H-proton 16 that escapes from the AlGaN layer 14.

The present disclosure is based on the abovementioned new knowledge found by the present inventors.

(4) Characteristic Constitution of this Embodiment

Next, specific explanation will be given for a characteristic constitution of HEMT 20 according to this embodiment and the intermediate body 10 according to this embodiment constituting HEMT 20. Both HEMT 20 and the intermediate body 10 have great characteristics in a difference of H-concentration between the GaN layer 13 and the AlGaN layer 14.

(Upper Limit of a Difference of H-Concentration)

Specifically, the AlGaN layer 14 is constituted including a portion in which a H-concentration is higher than that of the GaN layer 13 and a difference of H-concentration from that of the GaN layer 13 is $2 \times 10^{18}$ cm$^{-3}$ or less. The portion in which the abovementioned difference of H-concentration is $2 \times 10^{18}$ cm$^{-3}$ or less, preferably exists over the whole of the AlGaN layer 14, but may exist at only a part of the AlGaN layer 14.

More preferably, the AlGaN layer 14 is constituted including a portion in which the difference of H-concentration from that of the GaN layer 13 is $8 \times 10^{17}$ cm$^{-3}$ or less. The portion in which the difference of H-concentration is $8 \times 10^{17}$ cm$^{-3}$ or less, preferably exists over the whole of the AlGaN layer 14, but may exist at only a part of the AlGaN layer 14, as described above.

Thus, in the AlGaN layer 14, an upper limit of the difference of H-concentration from that of the GaN layer 13 is set such that the difference of H-concentration from that of the GaN layer 13 is $2 \times 10^{18}$ cm$^{-3}$ or less, more preferably $8 \times 10^{17}$ cm$^{-3}$ or less, and the difference of H-concentration from that of the GaN layer 13 is suppressed to be small. Therefore, for example, even in a case that H-proton 16 escapes from the AlGaN layer 14, H-proton 16 also escapes from the GaN layer 13 together with H-proton 16 that escapes from the AlGaN layer 14. Namely, since the H-concentration is balanced, it is possible to prevent a situation that the electron in the GaN layer 13 attracted to H-proton 16 in the AlGaN layer 14 escapes from the GaN layer 13, namely, the aging variation of 2DEG 15 in the GaN layer 13 is generated due to the escape of H-proton 16 from the AlGaN layer 14.

Figure 2:
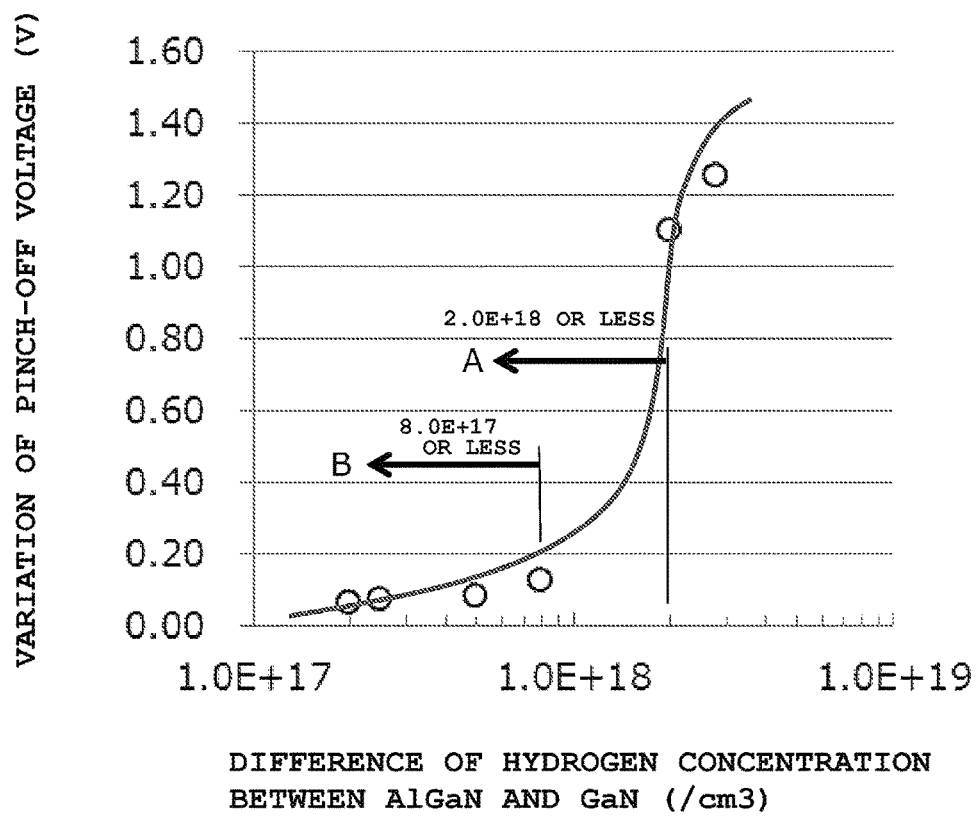
FIG. 2 is an explanation view showing an example of a relation of a difference in a hydrogen concentration between a first nitride semiconductor layer and a second nitride semiconductor layer, and a variation in a pinch-off voltage when the semiconductor device is constituted, in the nitride semiconductor template according to the present disclosure.

This situation is also clear from a measurement result shown in FIG. 2. FIG. 2 shows an example of a relation of the difference in H-concentration between the AlGaN layer 14 and the GaN layer 13, and a variation of a pinch-off voltage when HEMT is constituted.

For example, the aging variation of 2DEG 15 in the GaN layer 13 is suppressed when the difference of H-concentration between the GaN layer 13 and the AlGaN layer 14 is $2 \times 10^{18}$ cm$^{-3}$ or less. Therefore, the variation of the pinch-off voltage can be reduced when HEMT 20 is constituted (see an arrow A in figure), as compared with a case that the difference of H-concentration is larger than $2 \times 10^{18}$ cm$^{-3}$ (for example, in a case of $3 \times 10^{18}$ cm$^{-3}$). Specifically, for example, the variation of the pinch-off voltage exceeds 1.10 V in the case that the difference of H-concentration is $3 \times 10^{18}$ cm$^{-3}$. In contrast, when the difference of H-concentration is $2 \times 10^{18}$ cm$^{-3}$ or less, the variation of the pinch-off voltage can be reduced to about 0.80 V or less. Although the pinch-off voltage is generally about 3 V (for example, 2 V to 4 V depending on a constitutional specification) in a conventional HEMT, a practical great merit can be obtained when the variation of the pinch-off voltage can be reduced to 0.3 V or less corresponding to about 10% of that of the conventional HEMT.

Further, for example, when the difference of H-concentration between the GaN layer 13 and the AlGaN layer 14 is $8 \times 10^{17}$ cm$^{-3}$ or less, the aging variation of 2DEG 15 in the GaN layer 13 can be more suppressed. Therefore, the variation of the pinch-off voltage can be minimized (for example, 0.20 V or less) when HEMT 20 is constituted (see an arrow B in figure).

By suppressing the variation of the pinch-off voltage to be small, a fluctuation of a threshold voltage Vth can be suppressed to be small when HEMT 20 is constituted. Therefore, a reliability and an electric property of HEMT 20, etc., can be improved.

As described above, in the AlGaN layer 14, the difference of H-concentration from that of the GaN layer 13 is suppressed to be small such that the difference of H-concentration from that of the GaN layer 13 is $2 \times 10^{18}$ cm$^{-3}$ or less, preferably $8 \times 10^{17}$ cm$^{-3}$ or less at at least a part of the AlGaN layer 14, preferably over the whole thereof.

(Lower Limit of a Difference of H-Concentration)

Incidentally, in a case that the difference of H-concentration between the GaN layer 13 and the AlGaN layer 14 is excessively suppressed to be small, an electron mobility in the GaN layer 13 tends to reduce, because an deterioration of the interface is caused by adopting a method of reducing the H-concentration, when the nitride semiconductor epitaxial substrate 10 is manufactured using a method described later. Namely, when the difference of H-concentration is excessively suppressed to be small, the electron mobility in the GaN layer 13 is adversely affected in some cases, depending on a growth condition during a film formation.

As described above, the AlGaN layer 14 is constituted including a portion in which the difference of H-concentration from that of the GaN layer 13 is $3 \times 10^{17}$ cm$^{-3}$ or more. The portion in which the difference of H-concentration is $3 \times 10^{17}$ cm$^{-3}$ or more, may exist over the whole of the AlGaN layer 14. However, the constitution of the AlGaN layer 14 is not limited thereto. Preferably, the above portion may exist at only a part of the AlGaN layer 14, specifically, at at least a region 17 near an interface with the GaN layer 13 (also referred to as a region 17 hereafter) as described later.

Thus, in the AlGaN layer 14, a lower limit of the difference of H-concentration from that of the GaN layer 13 is set at least in the region 17. Therefore, it is possible to sufficiently secure the electron mobility when HEMT 20 is constituted, and improve the electric property of HEMT 20.

Figure 3:
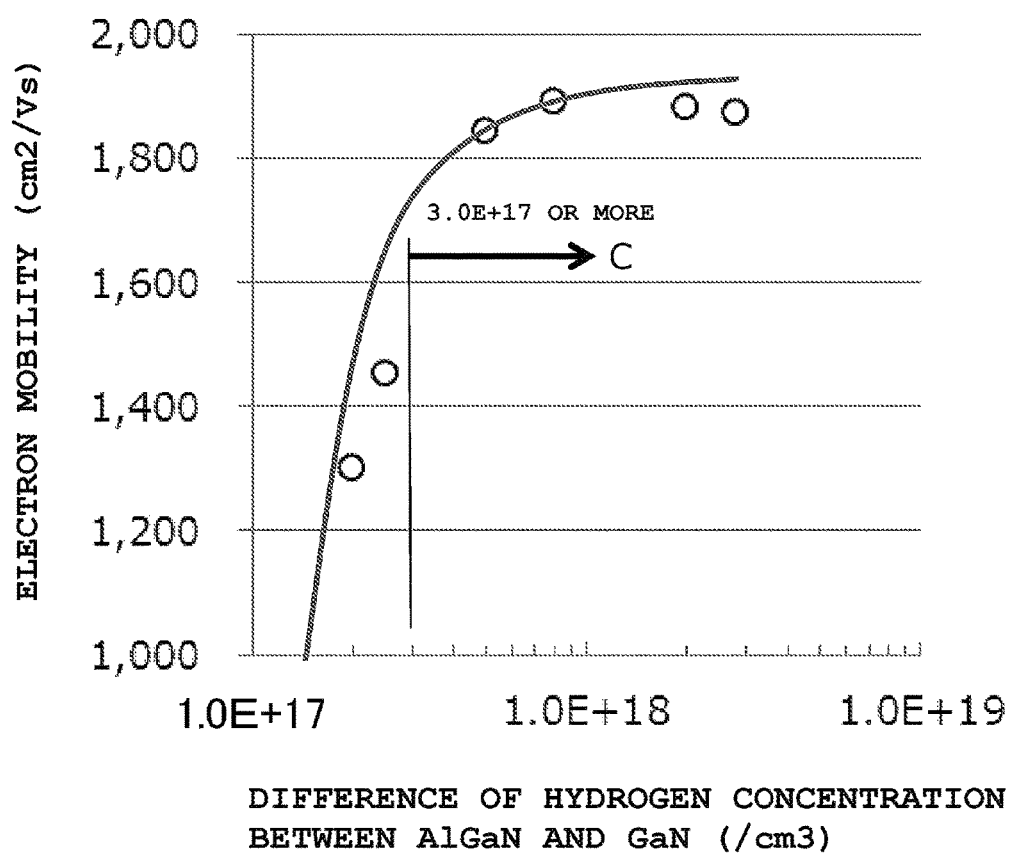
FIG. 3 is an explanation view showing an example of a relation of a difference in a hydrogen concentration between the first nitride semiconductor layer and the second nitride semiconductor layer, and an electron mobility when the semiconductor device is constituted, in the nitride semiconductor template according to the present disclosure.

This is also clear from a measurement result shown in FIG. 3. FIG. 3 shows an example of a relation of the difference in H-concentration between the AlGaN layer 14 and the GaN layer 13, and the electron mobility when HEMT is constituted.

For example, when the difference of H-concentration between the GaN layer 13 and the AlGaN layer 14 is $3 \times 10^{17}$ cm$^{-3}$ or more, the electron mobility can be 1700 cm$^2$/Vs or more for example when HEMT 20 is constituted, to thereby secure the sufficient electron mobility (see an arrow C in figure). Specifically, for example, when the difference of H-concentration is $3 \times 10^{17}$ cm$^{-3}$ or more, the electron mobility can be 1700 cm$^2$/Vs or more. However, in a case that the difference of H-concentration is about $2 \times 10^{17}$ cm$^{-3}$, the electron mobility is reduced to about 1300 cm$^2$/Vs and a current value is reduced by 20% or more. Although it is conceivable that a problem occurs due to a reduction of the current by about 10% when being compared in the same constitutional specification, a practical great merit can be obtained as long as a sufficient electron mobility can be secured in order to prevent the above situation.

By securing the sufficient electron mobility, the electric property, etc., can be improved when HEMT 20 is constituted.

As described above, in the AlGaN layer 14, the lower limit of the difference of H-concentration from that of the GaN layer 13 is set such that the difference of H-concentration is $3 \times 10^{17}$ cm$^{-3}$ or more, at least in a part of the AlGaN layer 14, specifically in the region 17.

(Arrangement of a Lower Limit Setting Portion in a Difference of H-Concentration)

As described above, in the AlGaN layer 14, the difference of H-concentration from that of the GaN layer 13 is $3 \times 10^{17}$ cm$^{-3}$ or more, at least in the region 17. Namely, the AlGaN layer 14 has a region in which a hydrogen concentration is high, in the region 17. The region 17 as a high-hydrogen concentration region in which the difference of H-concentration is set to $3 \times 10^{17}$ cm$^{-3}$ or more, is a portion whose thickness is at least 1 nm from the interface with the GaN layer 13. The region 17 is a portion whose thickness is at least 1 nm therefrom. Therefore, the difference of H-concentration from that of the GaN layer 13 may be less than $3 \times 10^{17}$ cm$^{-3}$, or may be $3 \times 10^{17}$ cm$^{-3}$ or more, in a portion whose thickness exceeds 1 nm from the interface with the GaN layer 13, namely in a region 18 not near the interface with the GaN layer 13 (also referred to as a region 18 hereafter).

Thus, by setting the difference of H-concentration to $3 \times 10^{17}$ cm$^{-3}$ or more in the region 17 which is the portion whose thickness is at least 1 nm from the interface with the GaN layer 13, it is not necessary to excessively suppress the difference of H-concentration to be small in this portion, and therefore it is possible to suppress a deterioration of a state of the interface with the GaN layer 13. Namely, by securing the thickness of at least 1 nm as the region 17, the deterioration of the interface can be sufficiently suppressed. Therefore, by securing such a portion as the region 17, it is possible to suppress a situation in which the deterioration of the interface adversely affects 2DEG 15 in the GaN layer 13, thereby reducing the electron mobility. This is extremely preferable.

(A Value of H-Concentration)

Regarding a H-concentration in the GaN layer 13 and a H-concentration in the AlGaN layer 14, each H-concentration value (absolute value) is not particularly limited, as long as the difference of each H-concentration is set as described above. Namely, each H-concentration value may be set appropriately as long as the difference of H-concentration is satisfied as described above.

However, in order to satisfy the abovementioned difference of H-concentration, it is preferable to suppress each H-concentration value of the GaN layer 13 and the AlGaN layer 14 (particularly, the H-concentration value of the AlGaN layer 14) to be small, as described in detail later. This is because it is easy to suppress the difference of H-concentration between the GaN layer 13 and the AlGaN layer 14 to be relatively small, by suppressing each H-concentration value to be small.

Specifically, in order to satisfy the abovementioned difference of H-concentration, for example, it is conceivable that the H-concentration value of the GaN layer 13 is set to $1 \times 10^{18}$ to $1 \times 10^{18}$ cm$^{-3}$, more preferably $5 \times 10^{18}$ to $5 \times 10^{17}$ cm$^{-3}$, and the H-concentration value of the AlGaN layer 14 is set to $1 \times 10^{17}$ to $3 \times 10^{18}$ cm$^{-3}$, more preferably $3 \times 10^{17}$ to $2 \times 10^{18}$ cm$^{-3}$. Particularly, it is conceivable that a H-concentration value of the region 17 in the AlGaN layer 14 is set to $8 \times 10^{17}$ to $3 \times 10^{18}$ cm$^{-3}$, and a H-concentration value of the region 18 therein is set to $1 \times 10^{17}$ to $2 \times 10^{18}$ cm$^{-3}$.

(5) A Method for Manufacturing a Nitride Semiconductor Epitaxial Substrate and a Semiconductor Device Next, an explanation will be given for a method for manufacturing the intermediate body (namely, a nitride semiconductor epitaxial substrate according to this embodiment) having the abovementioned constitution, and a method for manufacturing HEMT (namely, a semiconductor device according to this embodiment) 20.

(A Method for Manufacturing a Nitride Semiconductor Epitaxial Substrate)

First, an explanation will be given for a case of manufacturing the intermediate body 10 which is an example of the nitride semiconductor epitaxial substrate.

In this embodiment, for example, the intermediate body 10 is manufactured using a Metal Organic Vapor Phase Epitaxy (MOVPE) apparatus, by the following procedure.

(S110: Substrate Preparation Step)

First, in manufacturing the intermediate body 10, a semi-insulating SiC substrate of polytype-4H for example, is prepared as the substrate 11.

(S120: GaN Layer Formation Step)

After the substrate 11 is prepared, the prepared substrate 11 is loaded into a process chamber of the MOVPE apparatus. Then, hydrogen (H$_2$) gas (or a mixed gas of H$_2$ gas and nitrogen (N$_2$) gas) is supplied into the process chamber as a carrier gas (a diluent gas), and a temperature of the substrate 11 is elevated to a predetermined growth temperature of the nucleation layer (for example, 1150° C. or more and 1250° C. or less). After the temperature of the substrate 11 becomes the predetermined growth temperature, for example, trimethyl aluminum (TMA) gas as a group III source gas and ammonia (NH$_3$) gas as a group V source gas are supplied to the substrate 11 respectively. Thereby, the AlN layer 12 made of AlN is grown on the substrate 11. After the AlN layer 12 is grown up to a predetermined thickness and the growth thereof is completed, supply of TMA gas is stopped. At this time, supply of NH$_3$ gas is continued.

Next, the temperature of the substrate 11 is adjusted to a predetermined growth temperature of the GaN layer 13 (for example, 1000° C. or more and 1100° C. or less). After the temperature of the substrate 11 becomes the predetermined growth temperature, for example, trimethyl gallium (TMG) gas as the group III source gas is supplied thereto while continuing supply of NH$_3$ gas. Thereby, the GaN layer 13 made of a single-crystal GaN is epitaxially grown on the AlN layer 12.

In this event, the carrier gas (the diluent gas) is supplied into the process chamber, in which only N$_2$ gas is used as the carrier gas, or the mixed gas of H$_2$ gas and N$_2$ gas is used as the carrier gas so that a concentration of N$_2$ gas is higher (for example, a partial pressure of N$_2$ gas/a partial pressure of H$_2$ gas: 1.0 to 3.0). Thereby, a mixture of H into the GaN layer 13 is suppressed.

In this event, the temperature of the substrate 11 is adjusted to be higher (for example, 1040° C. or more and 1100° C. or less) within the predetermined growth temperature range. Further, a pressure in the process chamber is adjusted to be slightly higher (for example, 13.3 kPa or more and 66.7 kPa or less). Thus, by adjusting the growth temperature and the pressure in the process chamber to be slightly higher, the mixture of H into the GaN layer 13 is suppressed.

By setting growth condition as described above, the GaN layer 13 satisfies the H-concentration value of $1 \times 10^{18}$ to $1 \times 10^{18}$ cm$^{-3}$ for example.

After the GaN layer 13 is grownup to a predetermined thickness and the growth thereof is completed, supply of TMG gas is stopped. At this time, supply of $NH_3$ gas is continued.

(S130: AlGaN Layer Formation Step)

Next, for example, the temperature of the substrate 11 is adjusted to a predetermined growth temperature of the AlGaN layer 14 (for example, 900° C. or more and 1100° C. or less). After the temperature of the substrate 11 becomes the predetermined growth temperature, for example, TMG gas and TMA gas as the group III source gas are supplied thereto while continuing supply of $NH_3$ gas. Thereby, the AlGaN layer 14 made of a single-crystal AlGaN is epitaxially grown on an electron transit layer.

In this event, the epitaxial growth of the AlGaN layer 14 is carried out in which the region 17 is first grown, and then the region 18 is grown.

The epitaxial growth of the region 17 is carried out under a growth condition that the deterioration of the state of the interface with the GaN layer 13 can be suppressed. Specifically, $H_2$ gas or the mixed gas of $H_2$ gas and $N_2$ gas (for example, the partial pressure of $N_2$ gas/the partial pressure of $H_2$ gas: 0.5 to 1.0) is supplied as the carrier gas (the diluent gas) into the process chamber, and the temperature of the substrate 11 is adjusted to a predetermined growth temperature (for example, 900° C. or more and 1080° C. or less). Further, the pressure in the process chamber is adjusted to be slightly lower (for example, 6.7 kPa or more and 13.2 kPa or less). Thereby, in the region 17, the deterioration of the state of the interface with the GaN layer 13 is suppressed.

It is conceivable that a thickness of the region 17 is set to 0.5 to 2.0 nm for example. This is because when the region 17 is excessively thick, the region 18 is relatively thin, as a result thereof, a percentage of a portion with the high H-concentration is increased and a percentage of a portion with a low H-concentration is decreased, and therefore there is a concern that an effect of suppressing the aging variation described later is lost.

After the growth of the region 17 is completed so as to be grown up to a thickness of 0.5 to 2.0 nm for example, preferably up to a thickness of at least about 1.0 nm sufficient for suppressing the deterioration of the state of the interface, subsequently, the epitaxial growth of the region 18 is carried out under a condition that the mixture of H into the AlGaN layer 14 can be suppressed.

Specifically, only $N_2$ gas is used as the carrier gas (the diluent gas) supplied into the process chamber, or the mixed gas of $H_2$ gas and $N_2$ gas is used as the carrier gas so that the concentration of $N_2$ gas is higher (for example, the partial pressure of $N_2$ gas/the partial pressure of $H_2$ gas: 1.0 to 3.0). Thereby, the mixture of H into the AlGaN layer 14 is suppressed.

In this event, the temperature of the substrate 11 is adjusted to be higher (for example, 1040° C. or more and 1100° C. or less) within the predetermined growth temperature range. Simultaneously, the pressure in the process chamber is adjusted to be slightly higher (for example, 13.3 kPa or more and 40.0 kPa or less). Thus, by adjusting the growth temperature and the pressure in the process chamber to be slightly higher, the mixture of H into the AlGaN layer 14 is suppressed.

By setting the growth condition as described above, the AlGaN layer 14 satisfies the H-concentration value of $1 \times 10^{17}$ to $3 \times 10^{18}$ $cm^{-3}$ for example.

The GaN layer 13 and the AlGaN layer 14 obtained through the abovementioned each step satisfy the difference of each H-concentration of $2 \times 10^{18}$ $cm^{-3}$ or less (preferably $8 \times 10^{17}$ $cm^{-3}$ or less). Further, at least the portion of the region 17 satisfies the difference of each H-concentration of $3 \times 10^{17}$ $cm^{-3}$ or more.

Each H-concentration value of the GaN layer 13 and the AlGaN layer 14 is preferably suppressed to be small in order to satisfy such a difference of H-concentration. This is because it is easy to suppress the difference of H-concentration between the GaN layer 13 and the AlGaN layer 14 to be relatively small by suppressing each H-concentration value to be small.

After the AlGaN layer 14 is grown up to a predetermined thickness and the growth thereof is completed, supplies of TMG gas and TMA gas are stopped, and the temperature of the substrate 11 is lowered from the growth temperature of the AlGaN layer 14. At this time, generally, supply of the carrier gas is stopped, $N_2$ gas is supplied as a purge gas, and supply of $NH_3$ gas is continued. Then, when the temperature of the nitride semiconductor epitaxial substrate becomes 500° C. or less, supply of $NH_3$ gas is stopped, and an atmosphere in the process chamber of the MOVPE apparatus is replaced with only $N_2$ gas and returned to an atmospheric pressure.

Then, after a temperature of the intermediate body 10 including the GaN layer 13 and the AlGaN layer 14 is lowered to a temperature at which the intermediate body 10 can be unloaded from the process chamber, the intermediate body 10 is unloaded from the process chamber.

As described above, the intermediate body 10 (namely, an example of the nitride semiconductor epitaxial substrate) as shown in FIG. 1 is manufactured.

(A Method for Manufacturing a Nitride Semiconductor Device)

Next, an explanation will be given for a case of manufacturing HEMT 20 as an example of the semiconductor device, using the intermediate body 10.

(S140: GaN Layer Formation Step)

In manufacturing HEMT 20, the intermediate body 10 is prepared, and then the intermediate body 10 is loaded into the process chamber of the MOVPE apparatus. Then, the same process as a case of the abovementioned GaN layer formation step (S120) is performed, the GaN cap layer 21 made of a single-crystal GaN is epitaxially grown on the AlGaN layer 14 in the intermediate body 10. After the GaN cap layer 21 is grown up to a predetermined thickness and a growth thereof is completed, the intermediate body 10 in which the GaN cap layer 21 is formed, is unloaded from the process chamber. The growth of this GaN cap layer 21 may be carried out continuously after the abovementioned AlGaN layer formation step (S130) while maintaining a high temperature state.

(S150: Electrode Formation Step)

Next, a resist film is formed on the GaN cap layer 21, and a patterning of the resist film is performed so as to form an opening in a region where the source electrode 23 and the drain electrode 24 are supposed to be formed in a planner view. Then, a multilayer structure of Ti/Al (or a multilayer structure of Ti/Al/Ni/Au) is formed so as to cover the GaN cap layer 21 and the resist film by an electron-beam evaporation method. Thereafter, the source electrode 23 and the drain electrode 24 are formed in the abovementioned predetermined region by removing the resist film by lift-off using a predetermined solvent, and annealing is applied to an entire body of the source electrode 23 and the drain electrode 24 for a predetermined time (for example, three minutes) at the predetermined temperature (for example, 650° C.) in $N_2$-atmosphere. Thereby, it is possible to form an ohmic junction between the GaN cap layer 21 and each of the source electrode 23 and the drain electrode 24.

Next, a resist film is formed so as to cover the GaN cap layer 21, the source electrode 23, and the drain electrode 24, and a patterning of the resist film is performed so as to form an opening in a region where the gate electrode 22 is supposed to be formed in a planner view. Then, a multilayer structure of Ni/Au is formed so as to cover the GaN cap layer 21 and the resist film by an electron-beam evaporation method for example. Thereafter, the gate electrode 22 is formed in the abovementioned predetermined region by removing the resist film by lift-off using a predetermined solvent, and annealing is applied to the entire body of the gate electrode 22 for a predetermined time (for example, ten minutes) at a predetermined temperature (for example, 450° C.) in $N_2$-atmosphere.

As described above, HEMT 20 (namely, an example of the semiconductor device) is manufactured as shown in FIG. 1.

(6) Effect Obtained by this Embodiment

According to this embodiment, one or more of the following effects can be obtained.

(A) According to this embodiment, the GaN layer 13 and the AlGaN layer 14 are constituted including the portion in which the difference of H-concentration between these layers is $2 \times 10^{18}$ cm$^{-3}$ or less, and the difference of each H-concentration is suppressed to be small. Therefore, it is possible to suppress the occurrence of the aging variation of 2DEG 15 in the GaN layer 13. Further, by suppressing the aging variation of 2DEG 15, it is also possible to suppress the fluctuation of the device property when HEMT 20 is constituted.

Specifically, for example, by setting the difference of H-concentration between the GaN layer 13 and the AlGaN layer 14 to $2 \times 10^{18}$ cm$^{-3}$ or less, it is possible to reduce (for example, half or less) the variation of the pinch-off voltage when HEMT 20 is constituted, in comparison with a case that the difference of H-concentration is larger than $2 \times 10^{18}$ cm$^{-3}$ or less (for example $3 \times 10^{18}$ cm$^{-3}$). By suppressing the variation of the pinch-off voltage to be small, it is possible to suppress the fluctuation of the threshold voltage Vth when HEMT 20 is constituted to be small, and improve the reliability and the electric property of HEMT 20, etc.

Namely, according to this embodiment, it is possible to suppress the aging variation of 2DEG 15, and improve the reliability and the electric property, etc., when HEMT 20 is constituted.

(B) Particularly, as described in this embodiment, by constituting the GaN layer 13 and the AlGaN layer 14 including the portion in which the difference of H-concentration between these layers is $8 \times 10^{17}$ cm$^{-3}$ or less, it is possible to suppress the aging variation of 2DEG 15 in the GaN layer 13. This is extremely preferable.

Specifically, for example, by setting the difference of H-concentration between the GaN layer 13 and the AlGaN layer 14 to $8 \times 10^{17}$ cm$^{-3}$ or less, the aging variation of 2DEG 15 in the GaN layer 13 can be more suppressed, and to thereby minimize (for example, 0.20 V or less) the variation of the pinch-off voltage when HEMT is constituted. Namely, it is possible to improve the reliability and the electric property, etc., when HEMT 20 is constituted. This is extremely preferable.

(C) Further, according to this embodiment, by constituting the GaN layer 13 and the AlGaN layer 14 including the portion in which the difference of H-concentration between these layers is $3 \times 10^{17}$ cm$^{-3}$ or more, it is possible to reduce an adversely effect on the electron mobility in the GaN layer 13 depending on the growth condition during the film formation.

Specifically, for example, by setting the difference of H-concentration between the GaN layer 13 and the AlGaN layer 14 to $3 \times 10^{17}$ cm$^{-3}$ or more, it is possible to obtain the electron mobility of 1700 cm$^2$/Vs or more for example when HEMT 20 is constituted, and secure the sufficient electron mobility.

Namely, according to this embodiment, even in a case that the difference of H-concentration between the GaN layer 13 and the AlGaN layer 14 is suppressed to be small, it is possible to sufficiently secure the electron mobility when HEMT 20 is constituted by setting the lower limit so as not to excessively suppress the difference of H-concentration to be small. Thus, by securing the sufficient electron mobility, it is possible to improve the electric property, etc., when HEMT 20 is constituted.

(D) Particularly, as described in this embodiment, by having the high-hydrogen concentration region where the lower limit of the difference of H-concentration is set in the region 17 in the AlGaN layer 14, it is not necessary to excessively suppress the difference of H-concentration to be small in this portion, and therefore the deterioration of the state of the interface with the GaN layer 13 can be suppressed. Therefore, by securing this portion as the region 17 which is the high-hydrogen concentration region, it is possible to suppress the situation in which the deterioration of the interface adversely affects 2DEG 15 in the GaN layer 13, thereby reducing the electron mobility. This is extremely preferable.

Other Embodiment

As described above, explanation has been given specifically for the embodiment of the present disclosure. However, the present disclosure is not limited thereto, and can be variously modified in a range not departing from the gist of the disclosure.

In the abovementioned embodiment, explanation has been given for an example of a case that the intermediate body (the nitride semiconductor epitaxial substrate) 10 is constituted by laminating the substrate 11, the AlN layer (the nucleation layer) 12, the GaN layer (the first nitride semiconductor layer) 13, and the AlGaN layer (the second nitride semiconductor layer) 14. However, the present disclosure is not limited thereto. The nitride semiconductor epitaxial substrate according to the present disclosure is not required to have the AlN layer (the nucleation layer) 12, or may have other layer which is not described in the abovementioned embodiment, as long as at least the first nitride semiconductor layer as the electron transit layer and the second nitride semiconductor layer as the electron supply layer are provided on the substrate.

Further, in the abovementioned embodiment, explanation has been given for an example of a case that the first nitride semiconductor layer as the electron transit layer is the GaN layer 13, and the second nitride semiconductor layer as the electron supply layer is the AlGaN layer 14. However, the present disclosure is not limited thereto. Namely, the first nitride semiconductor layer and the second nitride semiconductor layer are not limited to a case that these layers are made of GaN crystal or AlGaN crystal. The both layers may be made of a nitride crystal such as, for example, aluminum nitride (AlN), indium nitride (InN), indium gallium nitride (InGaN), aluminum indiumgalliumnitride (AlInGaN), namely, a nitride crystal represented by a composition formula of $Al_xIn_yGa_{1-x-y}N$ (0≤x+y≤1), as long as these layers are made of a single-crystal of the group III nitride semiconductor.

Further, in the abovementioned embodiment, HEMT 20 which is an example of FET, is given as an example of the semiconductor device manufactured using the intermediate body (the nitride semiconductor epitaxial substrate) 10. However, the present disclosure is not limited thereto, and can be applied to other semiconductor devices in the same manner.

Preferable Aspects of the Present Disclosure

Preferable aspects of the present disclosure will be supplementarily described hereafter.

[Supplementary Description 1]

According to an aspect of the present disclosure, there is provided a nitride semiconductor epitaxial substrate, including:
a substrate;
a first nitride semiconductor layer formed on the substrate, as an electron transit layer in which two-dimensional electron gas exists; and
a second nitride semiconductor layer formed on the first nitride semiconductor layer, as an electron supply layer,
wherein the second nitride semiconductor layer includes a portion in which a hydrogen concentration is higher than that of the first nitride semiconductor layer and a difference of the hydrogen concentration from that of the first nitride semiconductor layer is $2 \times 10^{18}$ cm$^{-3}$ or less.

[Supplementary Description 2]

Preferably, there is provided the substrate of the supplementary description 1, wherein the second nitride semiconductor layer includes a portion in which the difference of the hydrogen concentration from that of the first nitride semiconductor layer is $8 \times 10^{17}$ cm$^{-3}$ or less.

[Supplementary Description 3]

Preferably, there is provided the substrate of the supplementary description 1 or 2, wherein the second nitride semiconductor layer includes a portion in which the difference of the hydrogen concentration from that of the first nitride semiconductor layer is $3 \times 10^{17}$ cm$^{-3}$ or more.

[Supplementary Description 4]

Preferably, there is provided the substrate of any one of the supplementary descriptions 1 to 3, wherein the second nitride semiconductor layer has a high-hydrogen concentration region near an interface with the first nitride semiconductor layer.

[Supplementary Description 5]

Preferably, there is provided the substrate of the supplementary description 4, wherein the high-hydrogen concentration region is a portion whose a thickness is at least 1 nm from the interface with the first nitride semiconductor layer, and a difference of the hydrogen concentration from that of the first nitride semiconductor layer is $3 \times 10^{17}$ cm$^{-3}$ or more.

[Supplementary Description 6]

Preferably, there is provided the substrate of any one of the supplementary descriptions 1 to 5,
wherein the first nitride semiconductor layer has a value of a hydrogen concentration of $1 \times 10^{16}$ to $1 \times 10^{18}$ cm$^{-3}$, more preferably $5 \times 10^{16}$ to $5 \times 10^{17}$ cm$^{-3}$, and
the second nitride semiconductor layer has a value of a hydrogen concentration of $1 \times 10^{17}$ to $3 \times 10^{18}$ cm$^{-3}$, more preferably $3 \times 10^{17}$ to $2 \times 10^{18}$ cm$^{-3}$.

[Supplementary Description 7]

According to another aspect of the present disclosure, there is provided a semiconductor device, including:
a nitride semiconductor epitaxial substrate of any one of the supplementary descriptions 1 to 6; and
a source electrode, a drain electrode, and a gate electrode, which are formed on an upper side of the nitride semiconductor epitaxial substrate.

What is claimed is:

1. A nitride semiconductor epitaxial substrate, comprising:
   a substrate;
   a first nitride semiconductor layer formed on the substrate, as an electron transit layer in which two-dimensional electron gas exists; and
   a second nitride semiconductor layer formed on the first nitride semiconductor layer, as an electron supply layer,
   wherein in the whole second nitride semiconductor layer, a hydrogen concentration is higher than a hydrogen concentration of the first nitride semiconductor layer and a difference of the hydrogen concentration of the second nitride semiconductor layer from the hydrogen concentration of the first nitride semiconductor layer is $2 \times 10^{18}$ cm$^{-3}$ or less.

2. The nitride semiconductor epitaxial substrate according to claim 1, wherein the second nitride semiconductor layer includes a portion in which the difference of the hydrogen concentration from the hydrogen concentration of the first nitride semiconductor layer is $8 \times 10^{17}$ cm$^{-3}$ or less.

3. The nitride semiconductor epitaxial substrate according to claim 1, wherein the second nitride semiconductor layer includes a portion in which the difference of the hydrogen concentration from the hydrogen concentration of the first nitride semiconductor layer is $3 \times 10^{17}$ cm$^{-3}$ or more.

4. The nitride semiconductor epitaxial substrate according to claim 1, wherein the second nitride semiconductor layer has an interface region which is a portion having a thickness of 0.5 nm to 2 nm from an interface with the first nitride semiconductor layer,
   a hydrogen concentration in the interface region is $8 \times 10^{17}$ to $3 \times 10^{18}$ cm$^{-3}$.

5. The nitride semiconductor epitaxial substrate according to claim 4, wherein the interface region is a portion whose thickness is at least 1 nm from the interface with the first nitride semiconductor layer, and a difference of the hydrogen concentration between the interface region and the first nitride semiconductor layer is $3 \times 10^{17}$ cm$^{-3}$ or more.

6. A semiconductor device, comprising:
   a nitride semiconductor epitaxial substrate according to claim 1; and
   a source electrode, a drain electrode, and a gate electrode, which are formed on an upper side of the nitride semiconductor epitaxial substrate.

* * * * *

UNITED STATES PATENT AND TRADEMARK OFFICE
CERTIFICATE OF CORRECTION

PATENT NO. : 10,483,388 B2  
APPLICATION NO. : 16/010812  
DATED : November 19, 2019  
INVENTOR(S) : Tanaka Page 1 of 1

It is certified that error appears in the above-identified patent and that said Letters Patent is hereby corrected as shown below:

In the Specification

Column 8, Line 6: please add the number "10" between the words "embodiment)" and "having".

Column 8, Line 66: please replace the "$1 \times 10^{18}$" with --$1 \times 10^{16}$--.

Column 11, Line 60: please add the number "20" between the words "HEMT" and "is".

Signed and Sealed this  
Eighteenth Day of February, 2020

Andrei Iancu  
*Director of the United States Patent and Trademark Office*